United States Patent
Dijkstra et al.

(10) Patent No.: US 8,159,826 B2
(45) Date of Patent: Apr. 17, 2012

(54) SURFACE TREATMENTS FOR CONTACT PADS USED IN SEMICONDUCTOR CHIP PACKAGAGES AND METHODS OF PROVIDING SUCH SURFACE TREATMENTS

(75) Inventors: Paul Dijkstra, Eindhoven (NL); Hans Van Rijckevorsel, Ledeacker (NL); Roelf Groenhuis, Nijmegen (NL)

(73) Assignee: NXP B.V., Eindhoven (NL)

( * ) Notice: Subject to any disclaimer, the term of this patent is extended or adjusted under 35 U.S.C. 154(b) by 117 days.

(21) Appl. No.: 12/092,179

(22) PCT Filed: Nov. 3, 2006

(86) PCT No.: PCT/IB2006/054106
§ 371 (c)(1),
(2), (4) Date: Apr. 30, 2008

(87) PCT Pub. No.: WO2007/052234
PCT Pub. Date: May 10, 2007

(65) Prior Publication Data
US 2008/0230926 A1 Sep. 25, 2008

Related U.S. Application Data

(60) Provisional application No. 60/733,681, filed on Nov. 3, 2005.

(51) Int. Cl.
*H05K 7/00* (2006.01)

(52) U.S. Cl. .................................................. 361/760
(58) Field of Classification Search .................. 174/260, 174/261; 361/760, 767, 777
See application file for complete search history.

(56) References Cited

U.S. PATENT DOCUMENTS

| | | | |
|---|---|---|---|
| 3,827,918 A | 8/1974 | Ameen, et al. | |
| 6,964,918 B1* | 11/2005 | Fan et al. | 438/614 |
| 7,176,582 B2 | 2/2007 | Kloen et al. | |
| 7,247,938 B2 | 7/2007 | Groenhuis et al. | |
| 2005/0153483 A1 | 7/2005 | Groenhuis et al. | |

* cited by examiner

*Primary Examiner* — Jenny L Wagner

(57) ABSTRACT

An inorganic solder mask (48) for use as a surface treatment in masking a connection conductor (32) of a semiconductor chip package (10) against solder wetting when mounting the chip package (10) to a printed wiring board (50) or other substrate. The connection conductor (32) is partially covered by a metallization contact (42) formed from a distinct metal. The inorganic solder mask (46) is applied to an exposed portion (44) of the connection conductor (32) not covered by the metallization contact (42). The metallization contact (42) is not coated by the inorganic solder mask (46). The presence of the inorganic solder mask (46) significantly reduces or prevents wetting of the exposed portion (44) when molten solder is present on the connection conductor (32) without affecting the solidified solder layer (48) formed on the metallization contact (42). As a result, an extraneous mass of solder does not solidify on the exposed portion (44) of the connection conductor (32).

16 Claims, 3 Drawing Sheets

SURFACE TREATMENTS FOR CONTACT PADS USED IN SEMICONDUCTOR CHIP PACKAGAGES AND METHODS OF PROVIDING SUCH SURFACE TREATMENTS

This application is a 371 of PCT/IB2006/054106 filed on 3 Nov. 2006 which in turn, claims priority to U.S. Provisional Application 60/733,681 filed on 3 Nov. 2005.

The present invention relates generally to mounting structures and methods for a semiconductor chip package and, in particular, to surface treatments for contact pads of the semiconductor chip package in which regions of the contact pad uncovered by a metallization contact are masked selective to the metallization contact by a masking layer that regulates wetting by molten solder.

Semiconductor die or chips carrying an integrated circuit may be packaged into a chip package and then surface mounted to a substrate, such as a printed wiring board (PWB) or printed circuit board (PCB), to form an electronic assembly. A common type of chip package is a surface mount device (SMD) that includes contact pads that are connected by soldering to complementary contact pads on the printed wiring board. The chip package is manipulated by a placement machine, such as a pick-and-place machine, onto a specified location on the printed wiring board and subsequently soldered to the printed wiring board. The printed wiring board provides both the physical structure for mounting and holding the chip package as well as a pattern of conductive traces extending from the contact pads to electrically interconnect the semiconductor chip inside the chip package with other components mounted to the printed wiring board, such as discrete passive components or other semiconductor chips. These additional components, which may be proximal or remote electronic devices that are either packaged or unpackaged, are used for supplying power to, controlling, or otherwise interacting electronically with the semiconductor chip encapsulated inside the surface mounted device.

Chip packages are formed by mounting the semiconductor chip to a front side of a carrier, such as a leadframe. Conductive paths are established between bond pads on a front surface of the semiconductor chip and bond pads on the front side of the carrier. One approach for establishing these conductive paths is a wire bonding process in which individual leads extend from the chip bond pads outwardly beyond the peripheral edges of the chip to the carrier bond pads. The leads, which are defined by fine wire, are bonded at each opposite end to the corresponding bond pads. The conductive paths defined by the leads supply chip-to-carrier interconnections that provide the electrical paths for power and signal distribution. The coupled semiconductor die and carrier are encapsulated in a protective mass of molding material. The rear side of the carrier includes contact pads, which are exposed after encapsulation to form the package, that are electrically coupled with the bond pads on the front side of the carrier.

The metallization contacts on the contact pads of the chip package are attached to complementary contact pads of the printed wiring board by a soldering process, generally accomplished by wave soldering, infrared (IR) reflow soldering, convective IR reflow soldering, or vapor phase reflow soldering. Although these approaches differ from each other, the end result is substantially the same, as the semiconductor chip is electrically connected to the printed wiring board by a metallic or inter-metallic bond. After all electronic components have been mounted on the printed wiring board, the combination of the printed wiring board and components constitutes an electronic assembly that is the fundamental building block for all larger scale electronic systems.

One difficulty with the soldering process is that the contact pad may be only partially covered by the metallization contact used to make an electrical connection with a corresponding contact pad on the printed wiring board. This uncovered portion of the contact pad is frequently wetted by molten solder during soldering. Typically, the contact pad is composed of one metal, such as copper or nickel, and the metallization contact is composed of a different metal, such as gold or palladium-gold. Gold or palladium-gold, which is plated on top of the nickel, acts as a barrier against oxidation during assembly and post-assembly storage before use. Furthermore, gold or palladium-gold supplies a better surface for solder to attach, which improves the yield of the soldering process. However, as the soldering process is conducted, molten solder may migrate outside of the boundary of the metallization contact and wet the adjacent exposed metal of the contact pad. When the molten solder solidifies, a mass of solid solder is in an unwanted location on the contact pad outside of the perimeter of the metallization contact, which may lead to electrical shorting or cause other defects.

Organic masking substances may be applied to the exposed metal of the contact pad outside of the metallization contact. These organic masking substances operate by preventing the molten solder from wetting the underlying masked metal. Despite the advantages afforded by masking, organic masking substances are costly and cannot be applied with an accuracy that ensures that all of the exposed metal of the contact pad outside of the metallization contact perimeter is covered.

What is needed, therefore, is a method for selectively masking regions of a contact pad adjacent to a metallization contact against wetting by molten solder that overcomes the disadvantages of conventional masking methods that rely on organic masking substances.

In one embodiment of the present invention, a mounting structure comprises a carrier including a connection conductor with a contact pad carrying a metallization contact composed of a first conductor and an exposed region composed of a second conductor adjacent to said metallization contact. An inorganic masking layer is applied on the exposed region. The inorganic masking layer operates to significantly reduce wetting of the second portion by molten solder that, upon solidification, forms a solder layer on the metallization contact. The mounting structure may be used in an electronic assembly further comprising a carrier electrically coupled with a semiconductor die and a substrate having a contact pad that is coupled by the solder layer with the metallization contact of the contact pad of the carrier.

In another aspect of the present invention, a method for attaching a chip package to a substrate comprises partially covering a connection conductor of the chip package with a metallization contact, masking an exposed region of the connection conductor proximate to the metallization contact with an inorganic masking layer, and supplying molten solder on the metallization contact. The attachment method further comprises preventing solder wetting of the exposed region of the connection conductor with the inorganic masking layer, while allowing the molten solder to solidify to form a solder layer on the metallization contact for establishing an electrical connection between the metallization contact and a contact pad on the substrate.

In another aspect of the present invention, a method is provided for treating a connection conductor partially covered by a metallization contact and carried on a carrier supporting a semiconductor chip. The method comprises masking an exposed region of the connection conductor proximate to the metallization contact with an inorganic masking layer effective to preventing solder wetting of the exposed region.

The accompanying drawings, which are incorporated in and constitute a part of this specification, illustrate embodiments of the invention and, together with a general description of the invention given above and the detailed description of the embodiments given below, serve to explain the principles of the invention.

Figure 1:
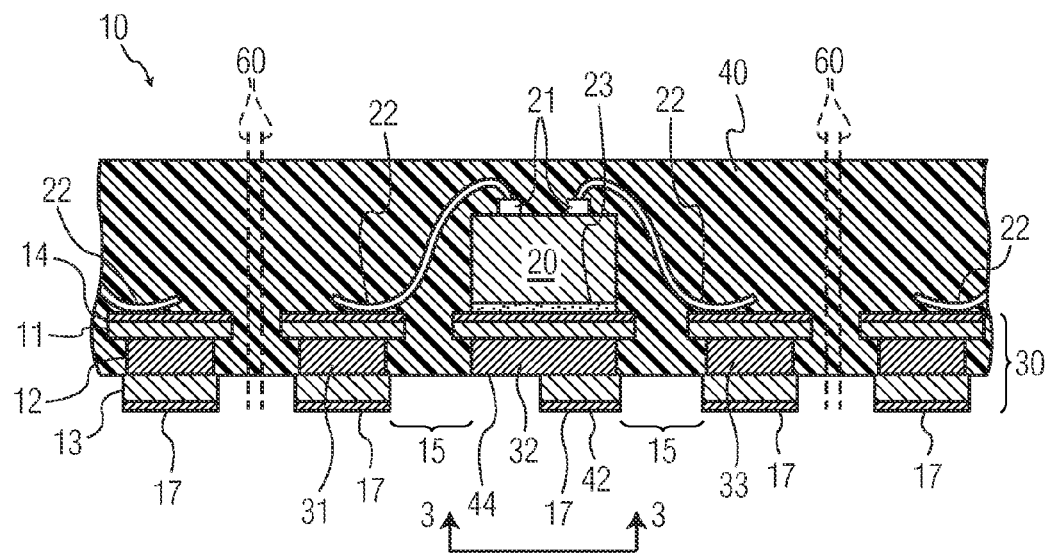
FIG. 1 is a diagrammatic cross-sectional view of a carrier and a semiconductor chip mounted to form a chip package before the carrier is partitioned to singulate the individual chip packages.

The present invention provides methods for providing an inorganic solder mask that coats exposed portions of a contact pad of a semiconductor chip package that are spatially positioned near metallization contacts composed of a different conductor or metal. The present invention will now be described in greater detail by referring to the drawings that accompany the present application.

With reference to FIG. 1, a semiconductor chip package 10 includes a carrier 30 with a stack or plurality of patterned metal layers 11, 12, 13 and a semiconductor die or chip 20. Layers 11, 12, 13 are sectioned into a number of mutually-isolated connection conductors 31, 32, 33 having side edges that are mutually isolated by apertures 15. Layers 11, 13 may comprise a conductor like copper (Cu) or a copper alloy and layer 12 may comprise a conductor such as nickel, molybdenum or titanium.

Figure 2:
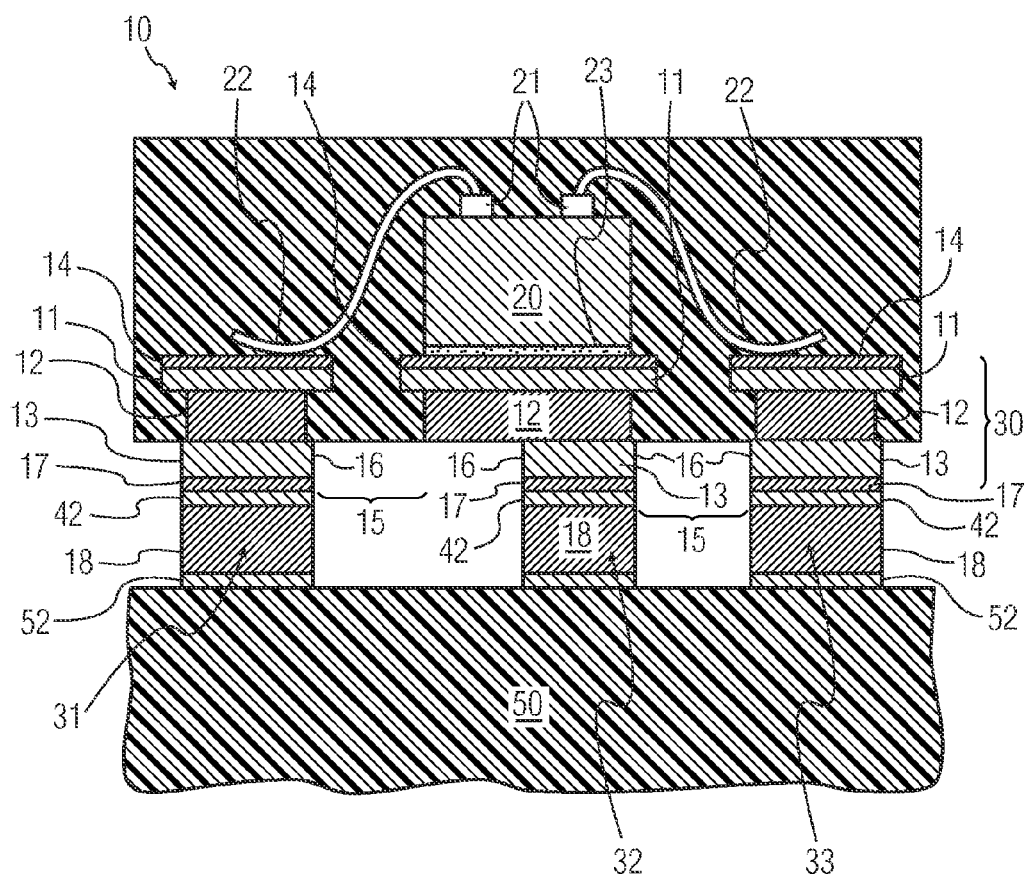
FIG. 2 is an enlarged diagrammatic cross-sectional, side view of one of the chip packages of FIG. 1 mounted to a printed wiring board to form an electrical assembly.

The semiconductor chip 20 includes bond pads in the form of connection regions 21. The semiconductor chip 20 is attached to the connection conductor 32, which comprises a die attach or bond pad 14, by a conductive adhesive layer 23. The conductive adhesive layer 23 provides a direct electrical connection between the backside of the semiconductor chip 20 and the connection conductor 32. Each of the connection regions 21 is electrically coupled with the bond pad 14 on a corresponding one of the connection conductors 31, 33 by one of a plurality of bonding wires 22. The bonding wires 22 may be formed from any suitable ductile conductor selected, for example, from gold, copper, aluminum, and alloys of these metals. The front side of the semiconductor chip 20 and bonding wires 22 are encapsulated by a cured mass of a molding compound 40, such as an epoxy molding compound or encapsulant, applied by a molding technique. Although only a single semiconductor chip 20 is shown, a person having ordinary skill in the art will understand that multiple semiconductor chips, each similar to semiconductor chip 20, are attached to carrier 30. Each of the semiconductor chips 20 and an associated bonded section of carrier 30 are singulated by, for example, a sawing technique directed generally along dashed lines 60 to provide a plurality of individual packages 10 (FIG. 2).

Each of the connection conductors 31, 32, 33 has a contact pad 17 exposed on one side of the package 10 for establishing electrical connections between the integrated circuit carried by the semiconductor chip 20 inside the package 10 and external circuitry. The contact pad 17 may consist of an intermediate coating of a metal (e.g., nickel) that is applied to the exposed metal of the corresponding one of the connection conductors 31, 32, 33. The connection conductor 32 is connected to ground and serves as a heat sink for the semiconductor die 20.

The contact pad 17 on at least connection conductor 32 is partially coated with a contact surface or metallization contact 42 (FIG. 3) constituted by a relatively thin adherent layer composed of an electrically conductive material. The conductor constituting the metallization contact 42 may advantageously be a noble metal, such as gold or palladium gold, which operates as a barrier against oxidation during assembly and post-assembly storage before use, and also supplies a better surface for solder wetting and attachment to improve solderability.

A package and carrier similar package 10 and carrier 30 are further described in commonly assigned U.S. Pat. No. 7,176,582, issued Feb. 13, 2007 (from application Ser. No. 10/510,591) titled, "Semiconductor Device and Method of Manufacturing Same" and U.S. Pat. No. 7,247,938, issued Jul. 24, 2007 (from application Ser. No. 10/510,588) titled, "Carrier, Method of Manufacturing a Carrier and an Electronic Device," each of which is hereby incorporated by reference herein in its entirety. The invention, however, is not so limited as the principles of the invention are applicable to other package and carrier designs.

With reference to FIG. 2, the package 10 is mounted, after being singulated, to a substrate, such as a printed wiring board 50. The printed wiring board 50 includes a plurality of contact pads, of which contact pad 52 is shown, that are used to establish electrical connections with metal traces carried by the printed wiring board 50. A solder layer 48 is formed between the metallization contact 42 (FIG. 3) on the contact pad 17 of at least connection conductor 32 and the corresponding contact pad 52 on the printed wiring board 50. The material constituting solder layer 48 may be any reflowable metal or alloy capable of metallurgically bonding other metals together and that exhibits good wetting characteristics with the constituent metal of the metallization contact 42. Suitable reflowable materials include, but are not limited to, tin or a tin alloy that further includes a metal such as copper, indium, silver, bismuth, or lead. The solder layer 48 may originate from a solder paste, which comprises a mixture of flux and tin or a tin alloy, that is applied to the contact pad 52. The solidified solder layer 48 supplies a mechanical and electrical contact between the metallization contact 42 (FIG. 3) of the contact pad 52 and the corresponding contact pad 52 on printed wiring board 50.

Figure 3:
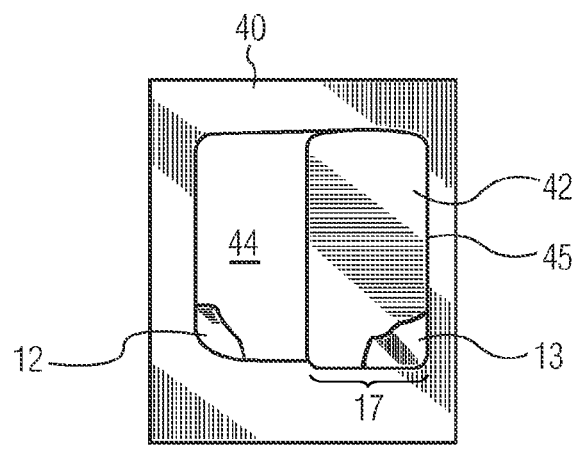
FIG. 3 is a diagrammatic bottom view taken generally along line 3-3 in FIG. 1 before processing to apply a surface treatment to portions of the contact pad not covered by a metallization contact in accordance with the principles of the present invention.

With reference to FIG. 3 in which like reference numerals refer to like features in FIG. 1, a surface or region 44 of layer 12 of, for example, connection conductor 32 is exposed proximate to the metallization contact 42 on the contact pad 17 of connection conductor 32. The exposed region 44 of layer 12 is recessed relative to the contact pad 17 to lie in a different horizontal plane than contact pad, where "vertical" means substantially perpendicular to the exposed surface of metallization contact 42 and "horizontal" means substantially parallel to the exposed surface of metallization contact 42. The exposed region 44 comprises the conductor of layer 12 (e.g., nickel, molybdenum or titanium), which differs in composition from the metal constituting the metallization contact 42 exposed adjacent to region 44. A perimeter 45 of the metallization contact 42 is generally registered with, and covers, the contact pad 17, which has a similar surface area as contact 42.

Figure 4:
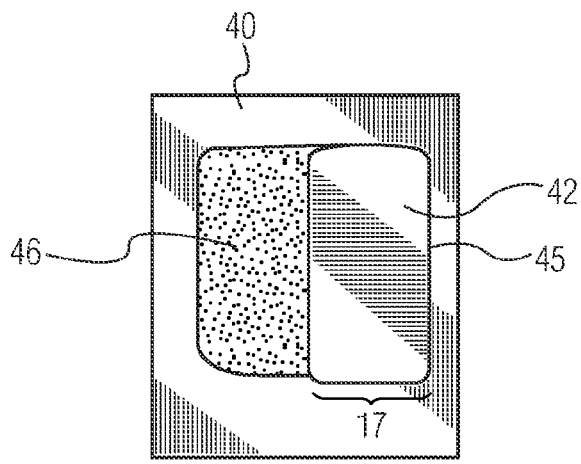
FIG. 4 is a diagrammatic bottom view similar to FIG. 3 in which the surface treatment has been selectively applied.
Figure 5:
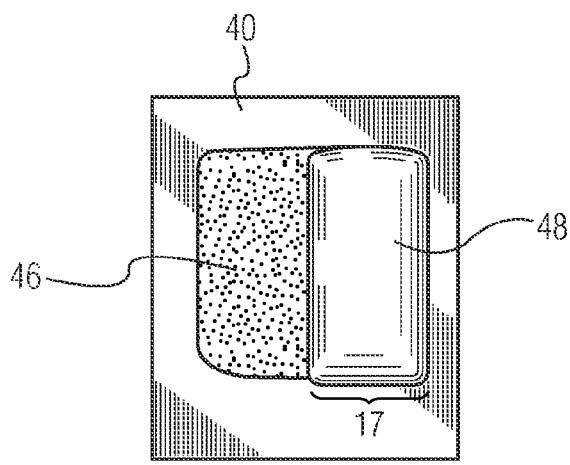
FIG. 5 is a diagrammatic bottom view of the contact pad of FIG. 2 shown with a solder layer applied to the metallization contact.

With reference to FIGS. 4 and 5 in which like reference numerals refer to like features in FIGS. 1-3, the exposed region 44 of layer 12 adjacent to contact pad 17 is coated, before solder layer 48 is applied, with a masking film or layer 46 composed of an inorganic masking material. When exposed to molten solder, the masking layer 46 is effective to significantly reduce or prevent wetting of the exposed region 44. However, the molten solder readily wets the metallization contact 42. Because the molten solder cannot wet the bare metal of the exposed region 44 or the molding compound 40, the molten solder is substantially confined within an outer perimeter 45 of the metallization contact 42. As a result, the solidified solder layer 48 is present predominantly on the metallization contact 42. After cool-down, the solidified solder layer 48 will have a contoured profile or geometrical shape that depends, among other variables, upon the amount of solder, the reflow time-temperature profile, and the strength of the surface tension. The solder layer 48 supplies a mechanical and electrical connection between the semiconductor chip 20 and the carrier 30.

The masking layer 46 may be composed of any inorganic substance effective to impart non-wettability to molten solder. In particular, the masking layer 46 may be a chrome-containing conversion coating, such as a chromate conversion coating, or a chrome-free conversion such as molybdate, sulphite/oxalate, or persulphate conversion coating. The masking layer 46 significantly reduces, or advantageously prevents, wetting of the masked exposed region 44 by molten solder. The metal constituting the exposed region 44 participates in forming the masking layer 46, which displaces any other surface layer (e.g., native oxide) on exposed region 44. The masking layer 46 is not merely an additive overlayer but instead incorporates metal originating from the exposed region 44.

Typically, the masking layer 46 is applied to the exposed region 44 on each of the contact pads 17 by cleaning the metal surface, rinsing, creating the conversion coating by exposing or contacting the metal of exposed region 44 to an appropriate solution, rinsing to remove excess solution, and drying. For example, the conversion coating may be formed by immersing or dipping the package 10 in a bath of an aqueous solution containing a source of hexavalent chromium ($Cr^{+6}$) or trivalent chromium ($Cr^{+3}$) ions, an acid (e.g., sulfuric or nitric acid), and one or more sources of an activator anions, generally selected from among the group of acetate, formate, sulfate, chloride, fluoride, nitrate, phosphate and sulfamate ions. The chromium ions may be provided by any suitable composition-soluble source, such as chromium oxide ($CrO_3$). The bath may be optionally heated above ambient or room temperature to promote efficient coating. The immersion time may range from about 5 seconds to several minutes, as required to produce the desired coating. The thickness of the conversion coating will depend, among other variables, upon the composition or chemistry of the solution constituting the bath in which package 10, and other adjacent packages 10, are immersed. The metallic chromium ions in the solution react with the base metal of layer 12 to grow the chromate conversion film that constitutes the masking layer 46. While not wishing to be limited by theory, it is believed that the chemical reaction that transpires in the bath grows a resultant chromate conversion coating that contains various hydrated chromium oxides, generally with the chromium in a high oxidation state.

Molybdate, sulphite/oxalate, and persulphate conversion coatings may be provided in a similar batch manner by substituting a solution having a different chemistry in the bath. The solution may also be applied by other techniques, such as spraying, brushing, or swabbing, apparent to a person having ordinary skill in the art.

Despite being wetted by the aqueous solution of the bath, the metal of the metallization contact 42 is unaffected by exposure to the aqueous solution of the bath, when the package 10 is immersed therein. The metal constituting the metallization contact 42 is chemically inert to the chemicals in the bath and, hence, does not react chemically with these chemicals. The molding compound 40 is likewise unaffected by wetting by the aqueous solution of the bath. As a result, the masking layer 46 is only applied to the exposed region 44 in a self-aligned process that intrinsically and systematically excludes the metallization contact 42 and the molding compound 40. This represents a distinct advantage over organic coatings that cannot be applied in such a manner. The masking layer 46 does not have to be stripped or otherwise removed from the exposed region 44 before use.

Figure 6:
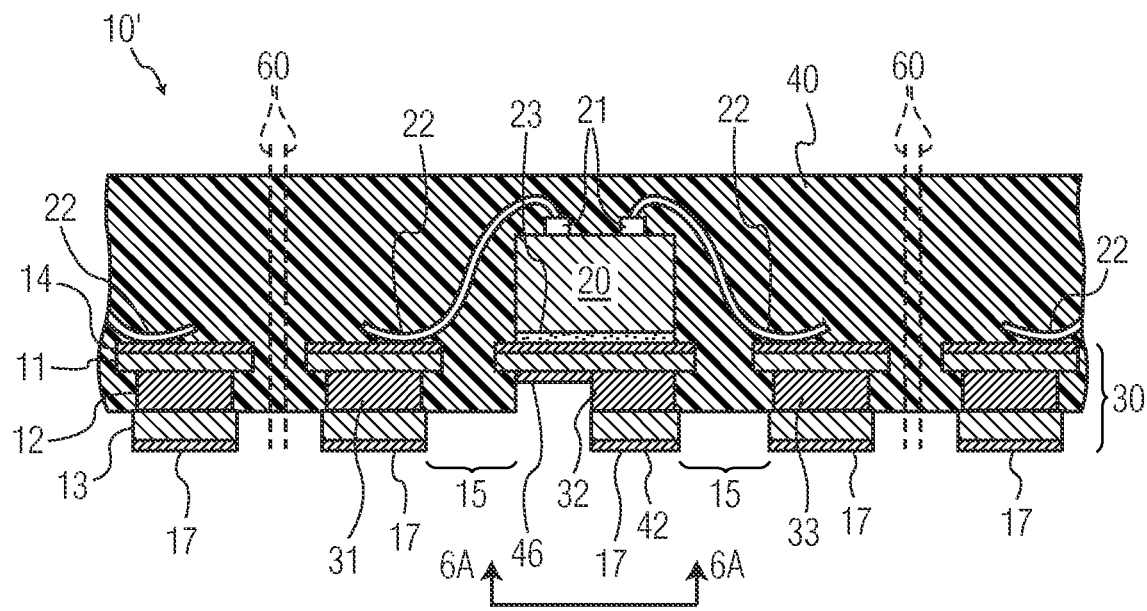
FIG. 6 is a diagrammatic cross-sectional view of a carrier and a semiconductor chip mounted to form a chip package before the carrier is partitioned to singulate the individual chip packages in accordance with an alternative embodiment of the present invention.
Figure 6A:
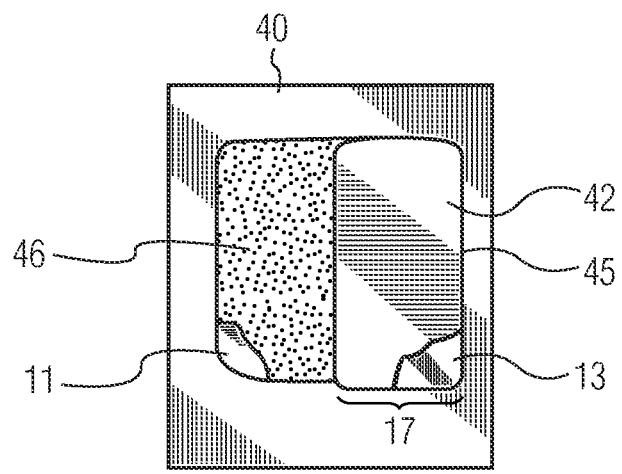
FIG. 6A is a diagrammatic bottom view taken generally along line 6A-6A in FIG. 6 after the surface treatment is applied for limiting solder wetting in accordance with the principles of the present invention.

With reference to FIGS. 6 and 6A in which like reference numerals refer to like features in FIGS. 1-5 and in accordance with an alternative embodiment of the present invention, a package 10' may be processed such that the exposed region 44 comprises the conductor of layer 11 (e.g., copper or a copper alloy), which differs in composition from the metal constituting the metallization contact 42 exposed adjacent to region 44. In this instance, the masking layer 46 is only applied to the exposed region 44 of layer 11 of connection conductor 32.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A semiconductor package for mounting onto a substrate, comprising:
    a semiconductor chip;
    a molding compound surrounding the semiconductor chip;
    a carrier attached to the semiconductor chip, the carrier including a connection conductor with a contact pad carrying a metallization contact composed of a first conductor and an exposed region composed of a second conductor adjacent to said metallization contact, wherein the exposed region is recessed relative to the contact pad to lie in a different horizontal plane than the contact pad; and
    an inorganic masking layer on said exposed region of said connection conductor, said inorganic masking layer operating to significantly reduce wetting of said exposed portion by molten solder that, upon solidification, forms a solder layer on said metallization contact.

2. The semiconductor package of claim 1, wherein said first conductor comprises a metal, and said inorganic masking layer comprises a conversion coating.

3. The semiconductor package of claim 2, wherein said conversion coating is selected from the group consisting of a molybdate conversion coating, a sulphite/oxalate conversion coating, and a persulphate conversion coating.

4. The semiconductor package of claim 1, wherein said second conductor comprises nickel, molybdenum, or titanium, and said first conductor comprises gold or palladium-gold.

5. The semiconductor package of claim 1, wherein said metallization contact has an outer perimeter, and further comprising:
a solder layer coating said metallization contact, said solder layer confined substantially within said outer perimeter of said metallization contact.

6. The semiconductor package of claim 1, wherein the masking layer is only applied to the exposed region of the connection conductor.

7. The semiconductor package of claim 1, wherein the carrier comprises a stack of patterned metal layers, wherein the stack of patterned metal layers are sectioned into a number of mutually-isolated connection conductors having side edges that are mutually isolated by apertures, and wherein the number of mutually-isolated connection conductors includes the connection conductor.

8. The semiconductor package of claim 1, wherein the semiconductor chip includes connection regions, wherein the semiconductor chip is attached to the connection conductor by a conductive adhesive layer, and wherein each of the connection regions is electrically coupled with a bond pad on another connection conductor by a bonding wire.

9. A method for attaching the semiconductor chip package of claim 1 to a substrate comprising:
supplying molten solder on the metallization contact;
preventing solder wetting of the exposed region of the connection conductor with the inorganic masking layer; and
attaching the semiconductor chip package to the substrate by allowing the molten solder to solidify to form a solder layer on the metallization contact for establishing an electrical connection between the metallization contact and a contact pad on the substrate.

10. The method of claim 9, wherein the inorganic masking layer further comprises a conversion coating, and masking the exposed region further comprises:
forming a conversion coating on the exposed region of the connection conductor of the semiconductor chip package.

11. The method of claim 10, wherein the conversion coating is selected from the group consisting of a molybdate conversion coating, a sulphite/oxalate conversion coating, and a persulphate conversion coating.

12. The method of claim 9, wherein the exposed region of the connection conductor comprises nickel, molybdenum, or titanium, and the metallization contact comprises gold or gold-palladium that is applied on the exposed region of the connection conductor.

13. The method of claim 9, wherein the masking layer is only applied to the exposed region of the connection conductor.

14. The semiconductor package of claim 1, wherein the exposed region is a surface region of a metal layer and wherein the contact pad is attached to the metal layer via a patterned metal layer.

15. The semiconductor package of claim 1, wherein the exposed region is a surface region of a metal layer and wherein the contact pad is attached to the metal layer via a second metal layer and a patterned metal layer.

16. The semiconductor package of claim 1, wherein said second conductor comprises nickel, molybdenum, or titanium and wherein the masking layer is only applied to the exposed region of the connection conductor.

* * * * *